(12) United States Patent
Chang (10) Patent No.: US 9,184,342 B1
(45) Date of Patent: Nov. 10, 2015

(54) LIGHT-EMITTING DIODE (71) Applicant: MIKRO MESA TECHNOLOGY CO., LTD., Apia (WS)

(72) Inventor: Pei-Yu Chang, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 14/470,947

(22) Filed: Aug. 28, 2014

(51) Int. Cl.
*H01L 33/00* (2010.01)
*H01L 21/00* (2006.01)
*H01L 33/02* (2010.01)
*H01L 33/32* (2010.01)

(52) U.S. Cl.
CPC ............ *H01L 33/025* (2013.01); *H01L 33/007* (2013.01); *H01L 33/32* (2013.01)

(58) Field of Classification Search
USPC .................. 257/17, 79, 94, 103; 438/69, 401, 438/FOR. 157
See application file for complete search history.

(56) References Cited

U.S. PATENT DOCUMENTS

| | | | | |
|---|---|---|---|---|
| 5,657,336 | A * | 8/1997 | Okuyama et al. | 372/45.01 |
| 7,364,805 | B2 * | 4/2008 | Morita et al. | 428/698 |
| 2005/0279994 | A1 * | 12/2005 | Ueda et al. | 257/33 |
| 2009/0267098 | A1 * | 10/2009 | Choi | 257/98 |
| 2012/0068196 | A1 * | 3/2012 | Smeeton et al. | 257/79 |

* cited by examiner

*Primary Examiner* — Jasmine Clark
(74) *Attorney, Agent, or Firm* — CKC & Partners Co., Ltd.

(57) ABSTRACT

A light-emitting diode (LED) includes a first type semiconductor layer, a second type semiconductor layer, an active layer, a dielectric layer and an electrode. The active layer disposed between the first type semiconductor layer and the second type semiconductor layer. The active layer has at least one threading dislocation therein. The dielectric layer is disposed on the second type semiconductor layer. The dielectric layer has at least one first opening therein to expose a part of the second type semiconductor layer. The vertical projection of the threading dislocation on the dielectric layer is separated from the first opening. The electrode partially disposed on the dielectric layer and electrically coupled with the exposed part of the second type semiconductor layer through the opening.

20 Claims, 8 Drawing Sheets

LIGHT-EMITTING DIODE

BACKGROUND

1. Technical Field

The present disclosure relates to light-emitting diodes (LEDs).

2. Description of Related Art

Light emitting diodes (LEDs) are semiconductor light-emitting devices which convert electric current into light energy. As light sources, LEDs have advantages including lower energy consumption, longer lifetime, smaller size, and faster switching, and hence conventional lighting, such as incandescent lighting, is gradually replaced by LEDs.

However, the luminous efficiency of LEDs may be affected by some factors. One of the factors is the amount of threading dislocating defects existing in the LED structure. Typically, threading dislocating defects arise in efforts to epitaxially grow one kind of crystalline material on a substrate of a different kind of material. Because of different crystalline lattice constants and different coefficients of thermal expansion of the two materials, lattice mismatch between the two materials creates stress during material deposition that generates threading dislocating defects while fabricating LED devices. Such threading dislocating defects in the emitting areas of LED devices may reduce luminous efficiency, especially when LEDs proceed to microscale.

SUMMARY

According to one embodiment of the present disclosure, a light-emitting diode (LED) includes a first type semiconductor layer, a second type semiconductor layer, an active layer, a dielectric layer and an electrode. The active layer disposed between the first type semiconductor layer and the second type semiconductor layer. The active layer has at least one threading dislocation therein. The dielectric layer is disposed on the second type semiconductor layer. The dielectric layer has at least one first opening therein to expose a part of the second type semiconductor layer. The vertical projection of the threading dislocation on the dielectric layer is separated from the first opening. The electrode partially disposed on the dielectric layer and electrically coupled with the exposed part of the second type semiconductor layer through the opening.

According to another embodiment of the present disclosure, the LED includes a first type semiconductor layer, a second type semiconductor layer, an active layer, a dielectric layer and an electrode. The active layer disposed between the first type semiconductor layer and the second type semiconductor layer. The active layer has a first region and a second region, in which the first region has a first threading dislocation density, the second region has a second threading dislocation density, and the first threading dislocation density is greater than the second threading dislocation density. The dielectric layer is disposed on the second type semiconductor layer. The dielectric layer has at least one opening therein to expose a part of the second type semiconductor layer. The vertical projection of the second region on the dielectric layer overlaps with the opening. The electrode is partially disposed on the dielectric layer and electrically coupled with the exposed part of the second type semiconductor layer through the opening.

The opening defines the contact interface between the first electrode and the second type semiconductor layer. When the LED is forward biased, charge carriers flow from the contact interface between the first electrode and the second type semiconductor layer to the junction of the first type semiconductor layer and the second type semiconductor layer. Since the vertical projection of the threading dislocation on the dielectric layer is separated from the opening, most electrons and holes recombine within the area having the lower threading dislocation density. Therefore, the luminous efficiency of the LED is improved.

In yet another embodiment, a method for manufacturing an LED includes the following steps:

(1) forming a first type semiconductor layer on a substrate, wherein the substrate has at least one dislocation-inducing feature thereon.

(2) forming an active layer on the first type semiconductor layer, in which the active layer has at least one threading dislocation therein, and the threading dislocation originates from the dislocation-inducing feature.

(3) forming a second type semiconductor layer on the active layer.

(4) forming a dielectric layer on the second type semiconductor layer.

(5) forming at least one opening in the dielectric layer, in which the vertical projection of the threading dislocation on the dielectric layer is separated from the opening.

(6) forming an electrode partially on the dielectric layer and electrically coupled with the second type semiconductor layer through the opening.

By forming the dislocation-inducing feature on the substrate, the tensile stress is more easily produced with the dislocation-inducing feature when the first type semiconductor layer is formed on the substrate. Therefore, the threading dislocation tends to originate from the dislocation-inducing feature and propagate obliquely due to the tensile stress. When the threading dislocation propagates into the active layer, the vertical projection of the threading dislocation on the dielectric layer is separated from the opening. Therefore, the luminous efficiency of the LED is improved.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The present disclosure relates to light-emitting diodes (LEDs). In one or more embodiments of the present disclosure, the LED includes at least one opening on its surface. The opening can limit the area where the current goes into the LED so that the current density within the emitting area of the LED can increase and can be more uniform. Furthermore, in one or more embodiments of the present disclosure, the openings can be aligned with the emitting area having a low density of threading dislocation defects, so as to improve the luminous efficiency of the LED.

Figure 1:
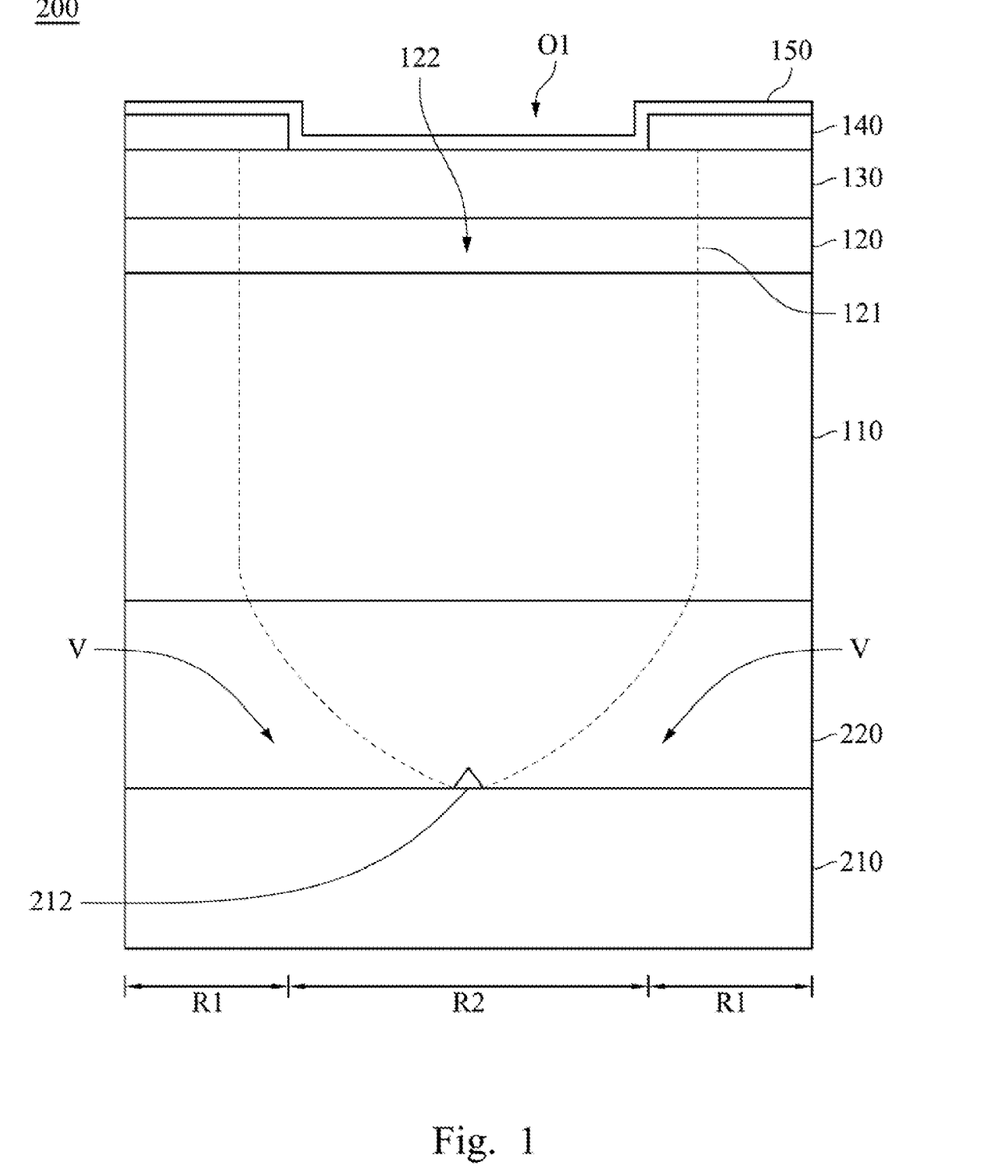
FIG. 1 is a cross-sectional view of an LED according to the first embodiment of this disclosure.

FIG. 1 is a cross-sectional view of an LED 200 according to the first embodiment of this disclosure. The LED 200 includes a first type semiconductor layer 110, an active layer 120, a second type semiconductor layer 130, a dielectric layer 140 and an electrode 150. The second type semiconductor layer 130 is disposed above the first type semiconductor layer 110. The active layer 120 is disposed between the first type semiconductor layer 110 and the second type semiconductor layer 130, in which the active layer 120 has at least one threading dislocation 121 therein. The dielectric layer 140 is disposed on the second type semiconductor layer 130. The dielectric layer 140 has at least one first opening O1 therein to expose a part of the second type semiconductor layer 130, in which the vertical projection of the threading dislocation 121 on the dielectric layer 140 is separated from the first opening O1. The electrode 150 is partially disposed on the dielectric layer 140 and is electrically coupled with the exposed part of the second type semiconductor layer 130 through the first opening O1.

As shown in FIG. 1, the first opening O1 defines a contact interface between the electrode 150 and the second type semiconductor layer 130. When the LED 200 is forward biased, charge carriers flow from the contact interface between the electrode 150 and the second type semiconductor layer 130 to the active layer 120. In the active layer 120, the electrons and holes recombine across the semiconductor gap, so the active layer 120 emits the light. Further, because the first opening O1 limits the area where the current goes into the LED 200, a light emitting area 122 in the active layer 120 can be formed under the first opening O1. More specifically, the vertical projection of the first opening O1 on the active layer 120 overlaps with the light emitting area 122. Since the vertical projection of the threading dislocation 121 on the dielectric layer 140 is separated from the first opening O1, the light emitting area 122 in the active layer 120 is also separated from the threading dislocation 121. Since the light emitting area 122 and the threading dislocation 121 are separated from each other, the luminous efficiency of the LED 200 is thus improved, especially when the LED 200 is a micro-LED, but is not limited thereto.

In some embodiments, the active layer 120 has a first region R1 and a second region R2. The first region R1 has a first threading dislocation density, and the second region R2 has a second threading dislocation density, in which the first threading dislocation density is greater than the second threading dislocation density. The vertical projection of the second region R2 on the dielectric layer 140 overlaps with the first opening O1. Since the first opening O1 defines the contact interface between the electrode 150 and the second type semiconductor layer 130, when the LED 200 is forward biased, charge carriers flow from the contact interface to the second region R2 of the active layer 120. That is, the light emitting area 122 of the active layer 120 is located in the second region R2. Because the second region R2 has lower threading dislocation density than the first region R1, the luminous efficiency of the LED 200 is thus improved through controlling the light emitting area 122 within the second region R2.

In some embodiments, the vertical projection of the first region R1 on the dielectric layer 140 is separated from the first opening O1. Therefore, the charge carriers from the first opening O1 can substantially avoid flowing into the first region R1 that has greater threading dislocation density than the second region R2. As a result, the luminous efficiency of the LED 200 may not be affected by the first region R1.

In some embodiments, the first region R1 has greater threading dislocation density on the order of about $10^5$~$10^7$/cm$^2$ or more. The second region R2 has lower threading dislocation density on the order of less than $10^5$~$10^7$/cm$^2$. In yet another embodiment, the ratio of the first threading dislocation density of the first region R1 to the second threading dislocation of the second region R2 is in average about $10^5$:1 to about 1:1.

In some embodiments, the LED 200 further includes a substrate 210. More specifically, the LED 200 may have a lateral structure. That is, there are two electrodes disposed on the same side of the LED 200, and in FIG. 1, only the electrode 150 is illustrated, and the other electrode is omitted.

As shown in FIG. 1, the substrate 210 has at least one dislocation-inducing feature 212 thereon. Since the lattice mismatch is created between the substrate 210 and a layer on the substrate 210, a tensile stress is produced followed by formation of the layer. The tensile stress is produced especially in the places where the dislocation-inducing feature 212 located, and thus, the threading dislocations 121 tend to originate from the dislocation-inducing feature 212. That is, the substrate 210 has at least one dislocation-inducing feature 212 thereon, and the threading dislocations 121 originate from the dislocation-inducing feature 212. More specifically, the threading dislocations 121 originate from the peripheral areas of the dislocation-inducing feature 121 and propagate obliquely due to the tensile stress. In some embodiments, the vertical projection of the first opening O1 on the substrate 210 overlaps with the dislocation-inducing feature 212. Since the threading dislocations 121 propagate obliquely from the dislocation-inducing feature 212, when the threading dislocations 121 propagate into the active layer 120, the light emitting area 122 aligned with the first opening O1 is separated from the threading dislocations 121. As a result, the luminous efficiency of the LED 200 is improved.

In some embodiments, The vertical projection of the first region R1 on the substrate 210 is separated from the dislocation-inducing feature 212, and the vertical projection of the second region R2 on the substrate 210 overlaps with the dislocation-inducing feature 212. Further, the vertical projection of the second region R2 on the dielectric layer 140 overlaps with the first opening O1, and thus, the light emitting area 122 is located within the second region R2 so that the luminous efficiency of the LED 200 is improved.

In some embodiments, the layer on the substrate 210 is a buffer layer 220, but is not limited thereto. In other embodiments, the layer on the substrate 210 may be the first type semiconductor 110. As shown in FIG. 1, in some embodiments, the threading dislocations 121 in the buffer layer 220 propagate obliquely, and after the threading dislocations 121 propagate into the first semiconductor layer 110, the active layer 120 and the second semiconductor layer 130, the threading dislocations 121 propagate substantially vertically.

In some embodiments, the current spreading length of the first type semiconductor layer 110 is greater than the current spreading length of the second type semiconductor layer 130. More specifically, the current spreading length of the first type semiconductor layer 110 is over 20 times greater than the current spreading length of the second type semiconductor layer 130. In this configuration, charge carriers in the second type semiconductor layer 130 are more difficult to spread to the side surface. In other words, charge carriers in the second type semiconductor layer 130 does not tend to flow into the area having greater threading dislocation density, thereby further increasing the luminous efficiency of the LED 100 or 200.

More specifically, the current spreading length of a semiconductor layer of a diode is determined by the following equation I: (Schubert '06, page 113 8.2, Theory of current spreading; Thompson, 1980)

$$L_s = \sqrt{\frac{\ln_{ideal} KT}{\rho J_0 e}},$$ Equation 1 where Ls is the current spreading length of the semiconductor layer of the diode, t is the thickness of the semiconductor layer, nideal is the ideality factor of the diode, K is the Boltzmann constant, T is the temperature of the semiconductor layer in Kelvin, ρ is the resistance of the semiconductor layer, J0 is the current density at the interface between the semiconductor layer and an electrode of the diode, and e is the charge of a proton.

In some embodiments, the first type semiconductor layer 110 is an n type semiconductor layer, and the second type semiconductor layer 130 is a p type semiconductor layer. In more detail, the first type semiconductor layer 110 is made of, for example, n-doped GaN:Si, and the second type semiconductor layer 130 is made of, for example, p-doped GaN or p-doped AlGaInP. The active layer 120 is made of, for example, heterostructure or quantum well structure. The dielectric layer 150 is made of a dielectric material, such as silicon nitride or silicon dioxide. The electrode 150 is made of a conductive material, such as metal or a transparent conductive material, e.g. indium tin oxide (ITO). The substrate 210 is a patterned sapphire substrate, and the dislocation-inducing feature 212 is a pattern on the patterned sapphire substrate. In other embodiments, the substrate 210 may be made of, for example, Si, SiC, GaAs, InP, AlN, GaP, GaN, and ZnSe, etc. The buffer layer 220 is made of a doped or undoped material such as GaN, AlN, AlGaN, InGaN, and InAlGaN, etc., so as to reduce the lattice mismatch with the substrate 210.

Although the dislocation-inducing feature 212 is a pattern on the substrate 210 in FIG. 1, the dislocation-inducing feature 212 is not limited to the pattern on the substrate 210. In some embodiments, since the threading dislocations 121 tend to originate from the lattice mismatch created between the substrate 210 and a layer on the substrate 210 in absence of the pattern on the substrate 210, the lattice mismatch may be considered as the dislocation-inducing feature 212 as well.

Figure 2:
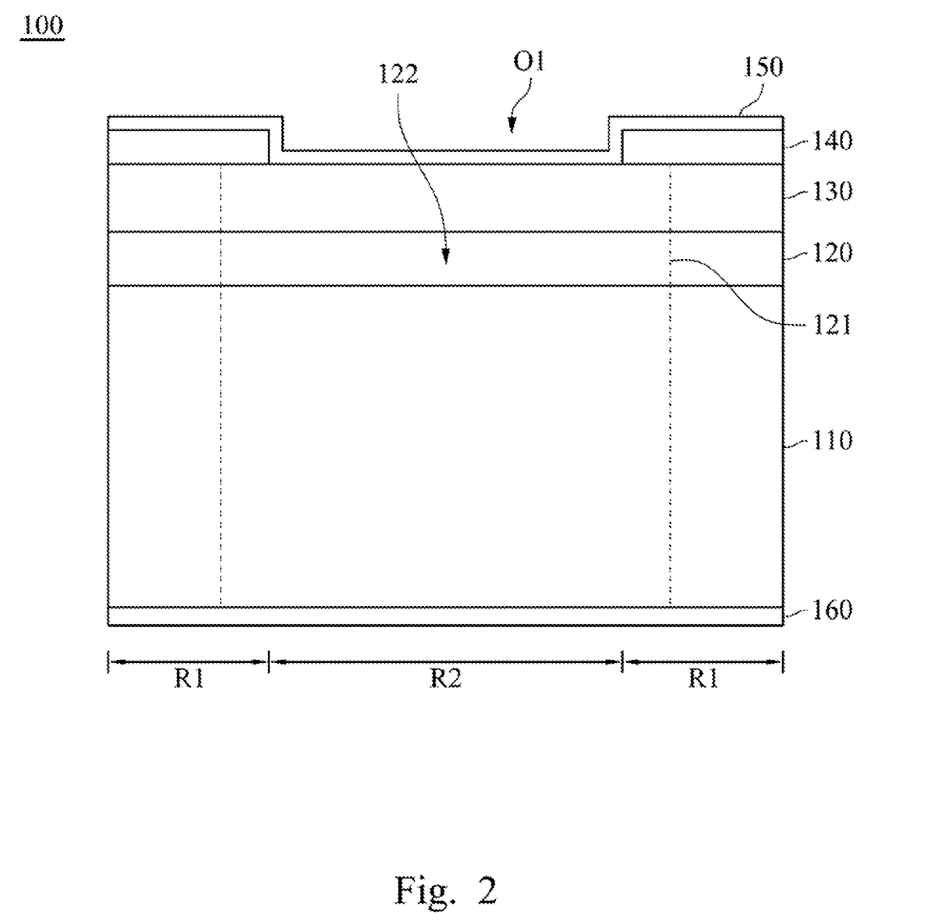
FIG. 2 is a cross-sectional view of an LED according to the second embodiment of this disclosure.

FIG. 2 is a cross-sectional view of an LED 100 according to the second embodiment of this disclosure. The difference between this embodiment and the first embodiment is that the LED 100 of FIG. 2 has a vertical structure. More specifically, the substrate 210 and the buffer layer 220 are removed in the FIG. 2. Further, the LED 100 includes an electrode 160. The electrode 160 is at least partially disposed on the first type semiconductor layer 110, such that the first type semiconductor layer 110, the active layer 120, and the second type semiconductor layer 130 are disposed between the electrode 150 and the electrode 160. The electrode 160 is electrically coupled with the first type semiconductor layer 110. In some embodiments, both the electrode 150 and the electrode 160 are made of a conductive material, such as metal or a transparent conductive material, e.g. indium tin oxide (ITO).

Figure 3:
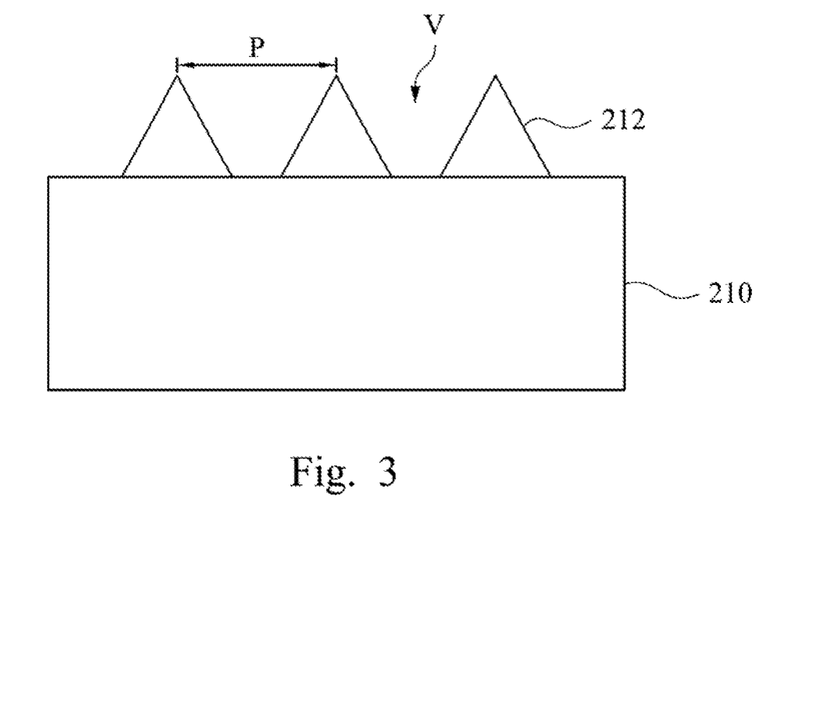
FIG. 3 is a cross-sectional view of the substrate and the dislocation-inducing features according to the third embodiment of the present disclosure.
Figure 4:
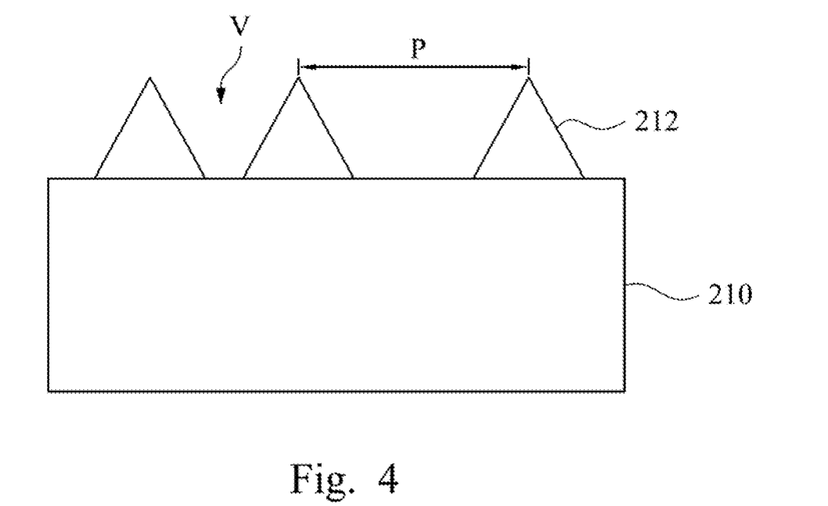
FIG. 4 is a cross-sectional view of the substrate and the dislocation-inducing features according to the forth embodiment of the present disclosure.

FIG. 3 is a cross-sectional view of the substrate 210 and the dislocation-inducing features 212 according to the third embodiment of the present disclosure. FIG. 4 is a cross-sectional view of the substrate 210 and the dislocation-inducing features 212 according to the forth embodiment of the present disclosure. Although FIG. 1 and FIG. 2 show that the LEDs 100 and 200 each has one first opening O1, the present disclosure is not limited thereto. In some embodiments, the LED 100 or 200 may have a plurality of the first openings O1. In the embodiments that the LED 100 or 200 has a plurality of the first openings O1, a plurality of the dislocation-inducing features 212 are on the substrate 210, and the dislocation-inducing features 212 are substantially equally spaced (as shown in FIG. 3) or are substantially unequally spaced (as shown in FIG. 4). Whether the dislocation-inducing features 212 are equally spaced or unequally spaced depends on the locations or the sizes of the first openings O1. For example, if the first openings O1 are equally spaced, the dislocation-inducing features 212 are designed to be equally spaced as well. Similarly, if the first openings O1 are unequally spaced or have different sizes, the dislocation-inducing features 212 are designed to be unequally spaced. With reference made to FIG. 1 and FIG. 2, the vertical projection of the first opening O1 on the substrate 210 overlaps with the dislocation-inducing feature 212. Since the threading dislocations 121 originate from the dislocation-inducing feature 212 and propagate obliquely, when the threading dislocations 121 propagate into the active layer 120, the threading dislocations 121 is separated from the light emitting area 122 of the active layer 120. As a result, the luminous efficiency of the LED 100 or 200 is improved.

With reference made to FIG. 3 and FIG. 1, a valley V is defined between adjacent two of the dislocation-inducing features 212. The vertical projection of the threading dislocations 121 on the substrate 210 overlaps with the valleys V, and the vertical projection of the first openings O1 on the substrate 210 overlaps with the dislocation-inducing features 212. That is, when the dielectric layer 140 is formed on the second semiconductor layer 130, the first openings O1 and the light emitting areas 122 are aligned with the dislocation-inducing features 212. Furthermore, since the threading dislocations 121 propagate obliquely due to the tensile stress, when the threading dislocations 121 propagate into the active layer 120, the light emitting areas 122 are separated from the threading dislocations 121. As a result, the luminous efficiency of the LED 100 or 200 is improved.

Figure 5:
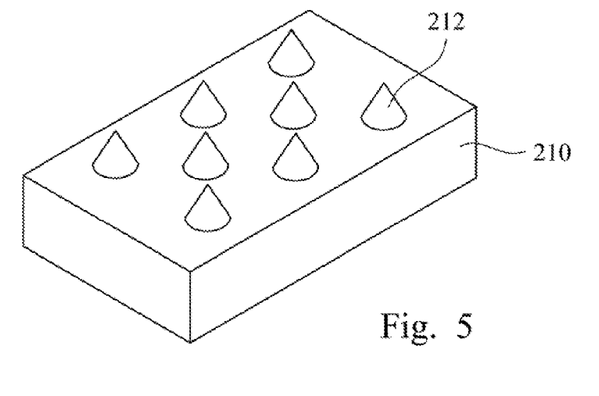
FIG. 5 is a perspective view of the plurality of the dislocation-inducing features according to the fifth embodiment of the present disclosure.
Figure 6:
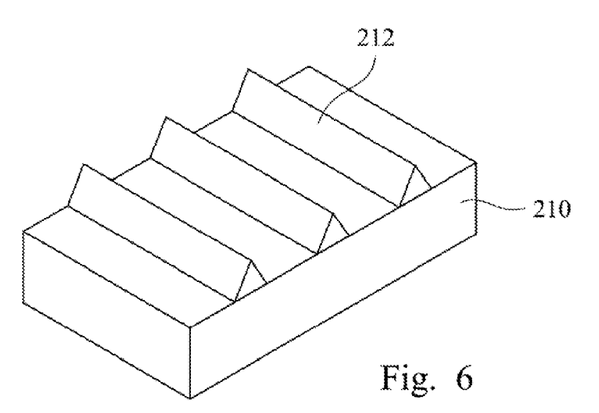
FIG. 6 is a perspective view of the plurality of the dislocation-inducing features according to the sixth embodiment of the present disclosure.
Figure 7:
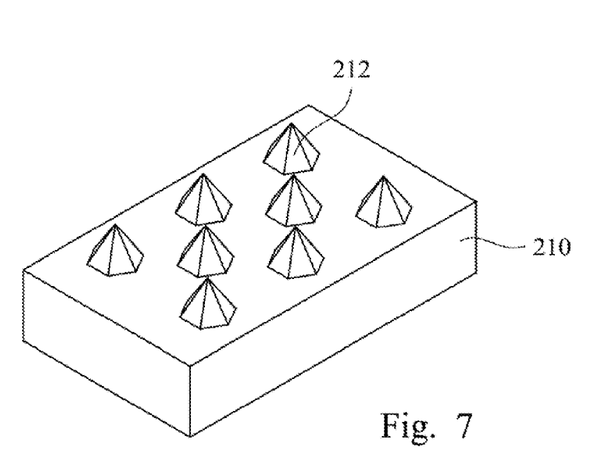
FIG. 7 is a perspective view of the plurality of the dislocation-inducing features according to the seventh embodiment of the present disclosure.

FIG. 5 is a perspective view of the plurality of the dislocation-inducing features 212 according to the fifth embodiment of the present disclosure. FIG. 6 is a perspective view of the plurality of the dislocation-inducing features 212 according to the sixth embodiment of the present disclosure. FIG. 7 is a perspective view of the plurality of the dislocation-inducing features 212 according to the seventh embodiment of the present disclosure. As shown in FIG. 5 to FIG. 7, the dislocation-inducing features 212 may be conical, strip-shaped, or polygonal. The shape of the dislocation-inducing features 212 is determined according to the shapes of the first openings O1. For example, if the first openings O1 are strip-shaped, the dislocation-inducing features 212 are also designed to be strip-shaped.

More specifically, the first openings O1 may be strip-shaped, circular or polygonal, and the dislocation-inducing features 212 on the substrate 210 may also be strip-shaped, conical, or polygonal, in which each of the first openings O1 is aligned with the dislocation-inducing feature 212 of the same shape or similar shape in the plane view of the LED 100 or 200.

Figure 8:
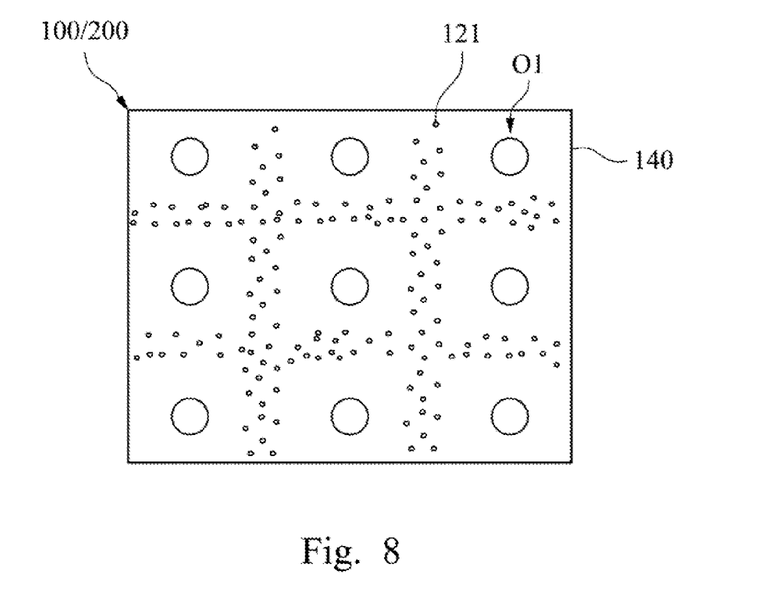
FIG. 8 is a plane view of the LED according to the eighth embodiment of the present disclosure.

FIG. 8 is a plane view of the LED 100 or 200 according to the eighth embodiment of the present disclosure. As shown in FIG. 3 and FIG. 8, the first openings O1 are respectively aligned with the dislocation-inducing features 212, the threading dislocations 121 are located between adjacent two of the first opening O1. In some embodiments, the pitch P between adjacent two of the dislocation-inducing features 212 is about 3 μm, and the first openings O1 each has a first diameter in a range from about 0.1 μm to about 2 μm.

Figure 9:
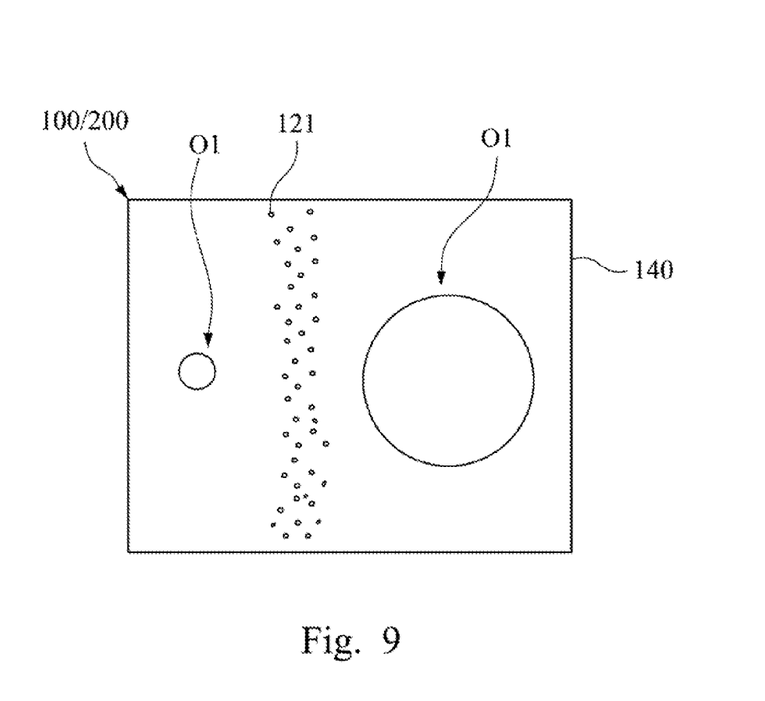
FIG. 9 is a plane view of the LED according to the ninth embodiment of the present disclosure.

FIG. 9 is a plane view of the LED 100 or 200 according to the ninth embodiment of the present disclosure. As shown in FIG. 4 and FIG. 9, the dislocation-inducing features 212 are substantially unequally spaced. In the embodiment of FIG. 9, the pitch P between adjacent two of the dislocation-inducing features 212 is designed based on the size of the first openings O1. For instance, if the first opening O1 has a greater size, the pitch P between adjacent two of the dislocation-inducing features 212 also has the greater distance. In some embodiments, the first opening O1 has a first diameter in a range from about 0.1 μm to about 20 μm, and the pitch P between adjacent two of the dislocation-inducing features 212 is in a range from about 0.5 μm to about 20 μm.

Figure 10:
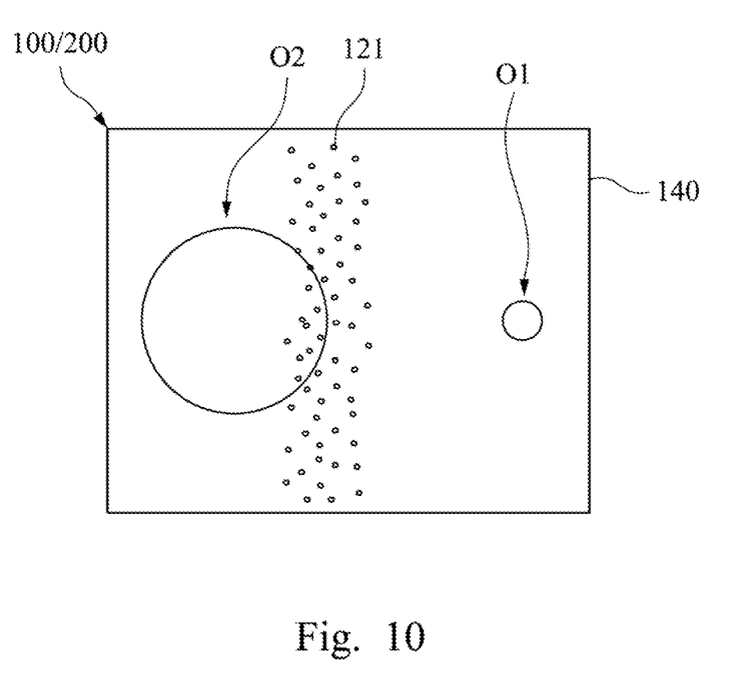
FIG. 10 is a plane view of the LED according to the tenth embodiment of the present disclosure.

FIG. 10 is a plane view of the LED 100 or 200 according to the tenth embodiment of the present disclosure. In some embodiments, the dielectric layer 140 further has at least one second opening O2 therein. The second opening O2 may have a second diameter in a range from about 10 μm to about 20 μm. As shown in FIG. 10, the size of the second opening O2 may be greater than the size of the first opening O1. Thus, the vertical projection of the threading dislocation 121 on the dielectric layer 140 may overlap with the second opening O2. Since the second opening O2 has the greater size than the first opening O1, the luminous intensity of the second opening O2 is greater than the first opening O1. As a result, even though the light emitting area that is aligned with the second opening O2 overlaps with the threading dislocations 121, the luminous efficiency of the second opening O2 may not be affected too severely.

Although the second opening O2 is not illustrated in FIG. 1 and FIG. 2, it should be understood that the second opening O2 can also expose a part of the second type semiconductor layer 130, so that the electrode 150 can be electrically coupled with the exposed part of the second type semiconductor layer 130 through the second opening O2.

For a better understanding of this disclosure, a method for manufacturing the LED 100 or 200 is provided. With reference made to FIG. 1 and FIG. 2, the method for manufacturing the LED 100 or 200 includes following steps:

Step (1): forming a first type semiconductor layer 110 on a substrate 210, in which the substrate 210 has at least one dislocation-inducing feature 212 thereon, and at least one threading dislocation originates from the dislocation-inducing feature 212.

The first type semiconductor layer 110 is an n type semiconductor layer. The substrate 210 is a patterned sapphire substrate, and the dislocation-inducing feature 212 is a pattern on the patterned sapphire substrate. The pattern can be formed by, for example, an etching process. The first type semiconductor layer 110 can be formed by, for example, epitaxy. Because the lattice mismatch is created between the substrate 210 and the first type semiconductor layer 110, the tensile stress is produced followed by formation of the first type semiconductor layer 110. The tensile stress is produced especially in the places where the dislocation-inducing feature 212 located, and thus, the threading dislocation 121 tends to originate from the dislocation-inducing feature 212.

In some embodiments, before forming the first type semiconductor layer 110 on the substrate 210, the method for manufacturing the LED 100 or 200 includes forming a buffer layer 220 (shown in FIG. 2) on the substrate 210, and the first type semiconductor layer 110 is formed on the buffer layer 220. The buffer layer 220 can be formed by, for example, epitaxy. The buffer layer 220 can be made of a doped or undoped material, so as to reduce the lattice mismatch with the substrate 210.

After forming the first semiconductor layer 110, the method for manufacturing the LED 100 or 200 includes:

Step (2): forming an active layer 120 on the first type semiconductor layer 110, wherein the active layer 120 has at least one threading dislocation 121 therein. In some embodiments, the active layer 120 has a first region R1 and a second region R2, in which the first threading dislocation density of the first region R1 is greater than the second threading dislocation density of the second region R2. In some embodiments, the active layer 120 is made of, for example, heterostructure or quantum well structure. The active layer 120 is formed by, for example, epitaxy.

After forming the active layer 120, the method for manufacturing the LED 100 or 200 includes:

Step (3): forming a second type semiconductor layer 130 on the active layer 120. In some embodiments, the second type semiconductor layer 130 is a p type semiconductor layer. The second type semiconductor layer 130 is formed by, for example, epitaxy.

After forming the second type semiconductor layer 130, the method for manufacturing the LED 100 or 200 includes:

Step (4): forming a dielectric layer 140 on the second type semiconductor layer 130; and Step (5): forming at least one opening in the dielectric layer 140, in which the vertical projection of the threading dislocation 121 on the dielectric layer 140 is separated from the opening.

In some embodiments, the dielectric layer 140 is made of a dielectric material, such as silicon nitride or silicon dioxide. The dielectric layer 140 is formed by, for example, physical vapor deposition (PVD). The opening, i.e. the first opening O1 or the second opening O2, is formed by, for example, a photolithography process. When the opening is formed, the opening can be aligned with the dislocation-inducing feature 212. When the opening is aligned with the dislocation-inducing feature 212, the vertical projection of the opening on the active layer 120 is separated from the threading dislocation 121. Therefore, the luminous efficiency of the LED 100 or 200 is improved.

After forming the opening in the dielectric layer 140, the method for manufacturing the LED 100 or 200 includes:

Step (6): forming an electrode 150 partially on the dielectric layer and electrically coupled with the second type semiconductor layer 130 through the opening. In some embodiments, the electrode 150 is made of a conductive material, such as metal or a transparent conductive material, e.g. indium tin oxide (ITO). The electrode 150 can be formed by, for example, physical vapor deposition (PVD) or chemical vapor deposition (CVD).

After forming the electrode 150, the manufacture of the LED 100 or 200 further includes chipping process. The chipping process can be accomplished by such as, but not limited to, dry etching, scribing and breaking, for example by inductively coupled plasma (ICP) etching, by mechanical sawing or by laser cutting. After the chipping process, one or more openings, i.e. the first opening O1 and/or the second opening O2, can be remained on the dielectric layer 140 of each of the LED dies.

Figure 11:
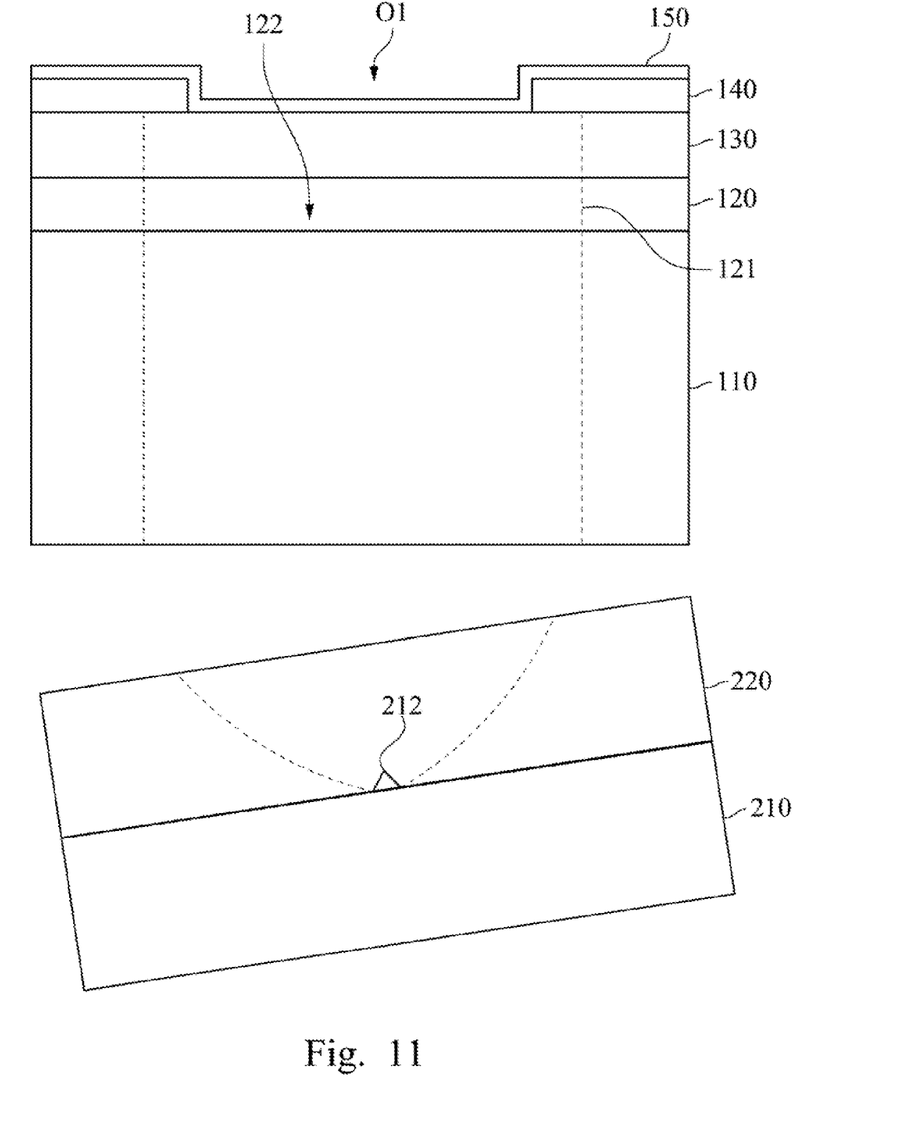
FIG. 11 is a lift-off step of manufacturing the LED of FIG. 2.

FIG. 11 is a lift-off step of manufacturing the LED 100 of FIG. 2. As shown in FIG. 11, in some embodiments, the method for manufacturing the LED 100 further includes removing the substrate 210 and/or the buffer layer 220. Since the LED 100 has the vertical structure, the substrate 210 and/or the buffer layer 220 needs to be removed by, for example, laser lift-off process. The lift-off step can be manufactured before or after chipping process.

Figure 12:
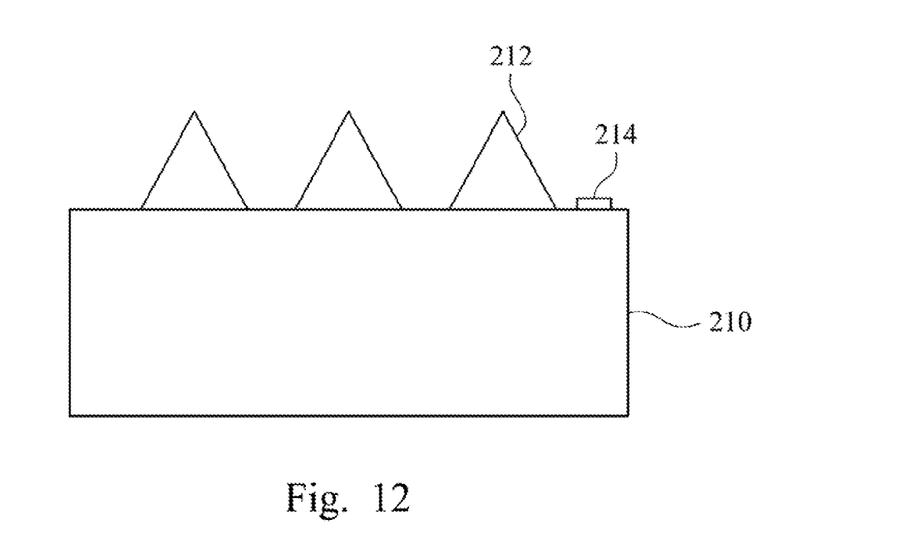
FIG. 12 is a cross-sectional view of the substrate having the alignment mark according to the tenth embodiment of the present disclosure.
Figure 13:
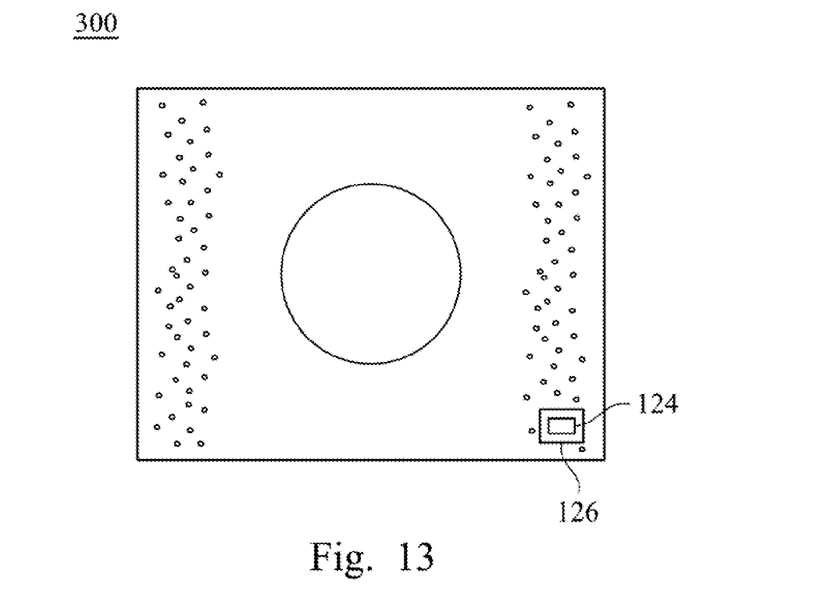
FIG. 13 is a plane view of the LED according to the eleventh embodiment of present disclosure.

FIG. 12 is a cross-sectional view of the substrate 210 with the alignment mark 214 according to the tenth embodiment of the present disclosure. FIG. 13 is a plane view of the LED 300 according to the eleventh embodiment of present disclosure. As shown in FIG. 12, before forming the first type semiconductor layer 110 on the substrate 210, the method for manufacturing the LED 100 or 200 further includes forming at least one alignment mark 124 on the substrate 210. In some embodiments, the alignment mark 124 is formed by the same method as that of forming the dislocation-inducing features 212.

As shown in FIG. 13, forming the opening in step (5) may further include aligning the opening with the dislocation-inducing feature 212 through the alignment mark 124. In more detail, another alignment mark 126 may formed by the same method as that of forming the opening. Therefore, by aligning the alignment mark 126 and the alignment mark 124, the opening can be aligned with the dislocation-inducing feature 212 precisely.

In summary, in order to prevent the threading dislocation defects from affecting the luminous efficiency of the LED, the light emitting area of the LED is separated from the threading dislocations. Furthermore, the LED includes the opening for limiting the area where the current goes into the LED. The vertical projection of the opening on the active layer is separated from the threading dislocation, so that the luminous efficiency of the LED can be improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims and their equivalents.

What is claimed is:

1. A light-emitting diode (LED), comprising:
    a first type semiconductor layer;
    a second type semiconductor layer;
    an active layer disposed between the first type semiconductor layer and the second type semiconductor layer, the active layer having at least one threading dislocation therein;
    a dielectric layer disposed on the second type semiconductor layer, the dielectric layer having at least one first opening therein to exposed a part of the second type semiconductor layer, wherein the vertical projection of the threading dislocation on the dielectric layer is separated from the first opening; and
    an electrode partially disposed on the dielectric layer and electrically coupled with the exposed part of the second type semiconductor layer through the opening.

2. The LED of claim 1, further comprising:
    a substrate having at least one dislocation-inducing feature thereon, wherein the threading dislocation originates from the dislocation-inducing feature.

3. The LED of claim 2, wherein the substrate is a patterned sapphire substrate, and the dislocation-inducing feature is a pattern on the patterned sapphire substrate.

4. The LED of claim 2, wherein the substrate and a layer on the substrate create a lattice mismatch therebetween to be the dislocation-inducing feature, and the layer on the substrate is a buffer layer or the first type semiconductor layer.

5. The LED of claim 2, wherein a plurality of the dislocation-inducing features are on the substrate, and a pitch between adjacent two of the dislocation-inducing features is in a range from about 0.5 µm to about 20 µm.

6. The LED of claim 2, wherein a plurality of the dislocation-inducing features are on the substrate, and a pitch between adjacent two of the dislocation-inducing features is about 3 µm.

7. The LED of claim 2, wherein a plurality of the dislocation-inducing features are on the substrate, and the dislocation-inducing features are substantially equally spaced.

8. The LED of claim 2, wherein a plurality of the dislocation-inducing features are on the substrate, and the dislocation-inducing features are substantially unequally spaced.

9. The LED of claim 2, wherein a plurality of the dislocation-inducing features are on the substrate, a valley is defined between adjacent two of the dislocation-inducing features, and the vertical projection of the threading dislocation on the substrate overlaps with the valley.

10. The LED of claim 2, wherein the active layer has a first region and a second region, the first region has a first threading dislocation density, the second region has a second threading dislocation density, the first threading dislocation density is greater than the second threading dislocation density, and the vertical projection of the first region on the substrate is separated from the dislocation-inducing feature.

11. The LED of claim 2, wherein the dislocation-inducing feature is strip-shaped, conical, or polygon.

12. The LED of claim 1, wherein the active layer has a first region and a second region, the first region has a first threading dislocation density, the second region has a second threading dislocation density, the first threading dislocation density is greater than the second threading dislocation density, and the vertical projection of the first region on the dielectric layer is separated from the first opening.

13. The LED of claim 1, wherein the first opening has a first diameter in a range from about 0.1 µm to about 20 µm.

14. The LED of claim 1, wherein the first opening has a first diameter in a range from about 0.1 μm to about 2 μm.

15. The LED of claim 1, wherein the dielectric layer has at least one second opening therein, the second opening has a second diameter in a range from about 10 μm to about 20 μm, and the vertical projection of the threading dislocation on the dielectric layer overlaps with the second opening.

16. A method for manufacturing an LED, comprising:
forming a first type semiconductor layer on a substrate, wherein the substrate has at least one dislocation-inducing feature thereon;
forming an active layer on the first type semiconductor layer, wherein the active layer has at least one threading dislocation therein, and the threading dislocation originates from the dislocation-inducing feature;
forming a second type semiconductor layer on the active layer;
forming a dielectric layer on the second type semiconductor layer;
forming at least one opening in the dielectric layer, wherein the vertical projection of the threading dislocation on the dielectric layer is separated from the opening; and
forming an electrode partially on the dielectric layer and electrically coupled with the second type semiconductor layer through the opening.

17. The method of claim 16, further comprising:
forming at least one alignment mark on the substrate;
wherein forming the opening comprises:
aligning the opening with the dislocation-inducing feature through the alignment mark.

18. The method of claim 16, further comprising:
removing the substrate.

19. An LED, comprising:
a first type semiconductor layer;
a second type semiconductor layer;
an active layer disposed between the first type semiconductor layer and the second type semiconductor layer, the active layer having a first region and a second region, wherein the first region has a first threading dislocation density, the second region has a second threading dislocation density, and the first threading dislocation density is greater than the second threading dislocation density;
a dielectric layer disposed on the second type semiconductor layer, the dielectric layer having at least one opening therein to exposed a part of the second type semiconductor layer, wherein the vertical projection of the second region on the dielectric layer overlaps with the opening; and
an electrode partially disposed on the dielectric layer and electrically coupled with the exposed part of the second type semiconductor layer through the opening.

20. The LED of claim 1, further comprising:
a substrate having at least one dislocation-inducing feature thereon, wherein the vertical projection of the opening on the substrate overlaps with the dislocation-inducing feature.

* * * * *